United States Patent [19]

Henry

[11] 4,178,557

[45] Dec. 11, 1979

[54] LINEAR AMPLIFICATION WITH NONLINEAR DEVICES

[75] Inventor: Paul S. Henry, Holmdel, N.J.

[73] Assignee: Bell Telephone Laboratories, Incorporated, Murray Hill, N.J.

[21] Appl. No.: 969,774

[22] Filed: Dec. 15, 1978

[51] Int. Cl.² ............................................. H03F 3/38
[52] U.S. Cl. ........................................ 330/10; 330/53; 330/124 R
[58] Field of Search ................ 330/10, 124 R, 53, 295

[56] References Cited

U.S. PATENT DOCUMENTS 3,777,275  12/1973  Cox .......................................... 330/10
3,927,379  12/1975  Cox et al. ................................ 330/10

OTHER PUBLICATIONS

Cox, "Linear Amplification with Nonlinear Components," *IEEE Transactions on Communications,* Dec. 1974, vol. Com-22, No. 12, pp. 1942-1945.

Cox et al., "Component Signal Separation and Recombination for Linear Amplification with Nonlinear Components," *IEEE Transactions on Communications,* Nov., 1975, vol. Com-23, No. 11, pp. 1281-1287.

*Primary Examiner*—James B. Mullins
*Attorney, Agent, or Firm*—Erwin W. Pfeifle

[57] ABSTRACT

The present linear amplifier uses nonlinear components where an input signal with amplitude and phase variations is concurrently applied to a limiter (41) and an envelope detector (42) which provide signals that serve as a carrier signal and a modulating signal, respectively, to a phase modulator comprising two or more linear suppressed-carrier amplitude modulators (50) connected in cascade. The weighted carrier signal and weighted outputs of the even-numbered amplitude modulators ($50_2$, $50_4$, ...) are added separately from the weighted outputs of the odd-numbered amplitude modulators ($50_1$, $50_3$, ...) to generate two signals which are combined in a quadrature coupler (56). The two outputs of the quadrature coupler are separately amplified in a pair of amplifiers (60, 61) and combined in a second quadrature coupler (64) to provide a substantially linearly amplified output signal of the input signal.

5 Claims, 2 Drawing Figures

LINEAR AMPLIFICATION WITH NONLINEAR DEVICES

BACKGROUND OF THE INVENTION

1. Technical Field

The present invention relates to a linear amplifier which uses nonlinear components and, more particularly, to a circuit for linearly amplifying a bandpass input signal having amplitude and phase variations which comprises a component separator for generating a first and a second output signal from the input signal, a first and a second amplifier for amplifying the first and second output signal from the component separator, and a coupler for combining the two amplified signals.

2. Description of the Prior Art

In many communication applications, a linear overall response of the transmitter power amplifier is required because the signal to be amplified contains amplitude variations and, in general, the use of a nonlinear device would cause undesirable distortion. Hence, systems utilizing standard AM transmission and those using more complex amplitude varying signals, such as ones having single sideband modulation or frequency multiplexed sets of separately modulated low-level carriers, both of which contain a composite of amplitude and phase fluctuations, are severely limited by the availability of linear amplifying devices.

Unfortunately, solid-state linear power amplifiers are difficult to build for high microwave and millimeter wave frequencies, and at lower frequencies high power linear devices are often unavailable or very expensive. Conversely, nonlinear solid-state power amplifiers are readily available at low microwave frequencies, and constant amplitude phase lockable signal sources (GUNN and IMPATT diodes) are available in the high microwave and millimeter wave regions. For high power applications in the microwave and lower frequency regions, nonlinear electron tube amplifiers and power oscillators are substantially less costly than are linear devices.

Typical prior art arrangements which provide linear amplification with nonlinear devices are disclosed in, for example, U.S. Pat. Nos. 3,777,275 issued to D. C. Cox on Dec. 4, 1973, and 3,927,379 issued to D. C. Cox et al on Dec. 16, 1975. In the Cox amplifier, amplification is provided by separating a bandpass input signal, which may have either or both amplitude and phase (frequency) variations, into two components, both of which are constant amplitude signals having variations in phase only. These two constant amplitude phase modulated signals are amplified separately by available state of the art amplifying devices having sufficient bandwidth but possibly nonlinear characteristics. The amplified component signals are then recombined linearly to reproduce an amplified replica of the input signal.

In the Cox et al arrangement, a bandpass input signal, which may have both amplitude and phase variations, is separated into a constant amplitude component containing information in phase variations and an envelope signal containing information in amplitude variations. An inverse sine phase modulator is used to modulate a sinuosidal reference signal with the envelope signal to produce a sinusoidal output signal whose frequency is the same as the frequency of the sinusoidal reference signal but whose phase is shifted by an amount proportional to the inverse sine of the envelope signal. The complex conjugate of the modulator output signal is generated and this signal and the constant amplitude component are multiplied by a first mixer to produce a first mixed output. The inverse sine phase modulator output signal and the constant amplitude component are multiplied by a second mixer to produce a second mixed output. Each of the two mixed outputs is separately filtered and each filtered resultant is separately amplified by either linear or nonlinear devices. The amplified filtered resultants are then combined to produce a linearly amplified replica of the original bandpass input signal.

The problem remaining in the prior art is to provide linear amplification with nonlinear devices without resorting to frequency multiplication or feedback techniques to permit wideband operation.

SUMMARY OF THE INVENTION

The foregoing problem has been solved in accordance with the present invention which relates to a linear amplifier which uses nonlinear components and, more particularly, to a circuit for linearly amplifying a bandpass input signal having amplitude and phase variations which comprises a component separator for generating a first and a second output signal from the input signal, a first and a second amplifier for amplifying the first and second output signal from the component separator and a coupler for combining the two amplified signals. The component separator comprises means for generating, from the input signal, a first and a second signal representative of the amplitude limited version and envelope, respectively, of the input signal and a nonlinear phase modulator which modulates the first signal with the second signal from the generating means and generates the first and second output signal from the component separator.

It is an aspect of the present invention that the phase modulator of the component separator be of a design which permits wideband operation and provides more precisely controlled modulation than can be obtained with the known Armstrong modulator, without resorting to frequency multiplication or feedback techniques.

Other and further aspects of the present invention will become apparent during the course of the following description and by reference to the accompanying drawings.

BRIEF DESCRIPTION OF THE DRAWING

Referring now to the drawings, in which like numerals represent like parts in the several views.

DETAILED DESCRIPTION

Figure 1:
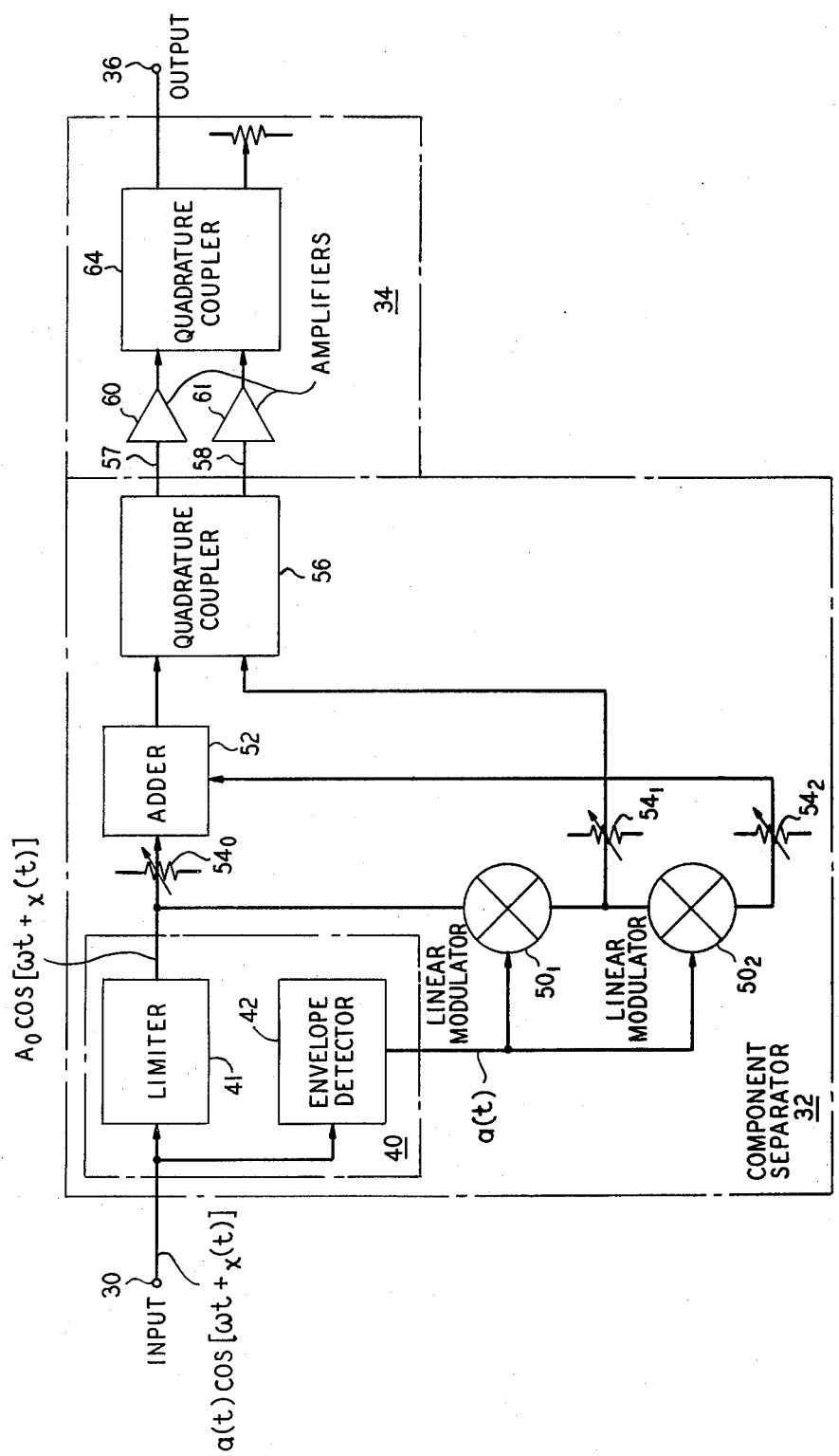
FIG. 1 is a block diagram of a LInear amplification with Nonlinear Devices (LIND) amplifier circuit in accordance with the present invention.

FIG. 1 illustrates the LInear amplification with Nonlinear Devices (LIND) amplifier circuit in accordance with the present invention. The present LIND amplifier circuit essentially comprises an input terminal 30 for receiving the signal to be linearly amplified, a component separator section 32, a power amplifier section 34 and an output terminal 36 for delivering the linearly amplified input signal to a particular utilization circuit (not shown).

For purposes of discussion hereinafter, it will be assumed that the input signal r(t) to be amplified at input terminal 30 is a bandpass signal which is defined by the expression $$r(t) = a(t) \cos[\omega t + X(t)], \quad (1)$$

where a(t) represents amplitude variations, $\omega$ is the carrier frequency, t represents time and X(t) represents phase variations. The input signal is concurrently applied to the input of both a linear 41 and an envelope detector 42 of a subcircuit 40 forming part of component separator 32.

Limiter 41 removes the amplitude variations of the input signal and produces at the output thereof an amplitude limited version of the input signal which can be expressed as $A_0 \cos[\omega t + X(t)]$, where $A_0$ represents the amplitude constant of the output signal. Envelope detector 42 generates, from the input signal, an output signal which is representative of the envelope a(t) of the input signal, r(t). It is to be understood that limiter 41 and envelope detector 42 can comprise any suitable circuit which is commercially available.

The remaining portion of component separator 32 comprises a novel wideband precision phase modulator which is a generalization of the well-known Armstrong modulator. The structure of this novel wideband precision phase modulator is the subject of a copending patent application Ser. No. 969,775 filed on the same day as the present invention in the name of the present inventor.

In the present precision phase modulator, the output signal from limiter 41 serves as a carrier signal and is applied to the input of a pair of linear suppressed carrier amplitude modulators, designated $50_1$ and $50_2$, arranged in cascade. Each linear modulator 50 is shown as comprising a first and a second input and an output. The output of a linear modulator is $(\alpha v) \cdot V(t) \cos \omega t$, where $V(t) \cos \omega t$ is the signal applied to the first input of the modulator, v is the signal applied to the second input, and $\alpha$ is a constant of proportionality characteristic of the modulator. The limiter 41 output signal is applied to the first input of the first modulator $50_1$ and to an input of an adder 52 through a weighting circuit $54_0$. For convenience, a weighting factor of $W_0 = 1$ will be used in the discussion hereinafter. However, such weighting factor is for exemplary purposes only and is not a requirement. Modulator $50_2$ has its first input connected to the output of the previous modulator $50_1$ and the second inputs of modulators $50_1$ and $50_2$ are coupled to receive the output signal from envelope detector 42 for modulating the input signal at the first input of the associated modulator 50.

The output signal from modulator $50_1$ is tapped off and is coupled through a weighting circuit $54_1$, which attenuates or amplifies the signal propagating therethrough by an appropriate weighting factor $W_1$, to one input of a quadrature coupler 56. The output signal from modulator $50_2$ is coupled through a separate weighting circuit $54_2$, which attenuates or amplifies the output signal from modulator $50_2$ by an appropriate weighting factor $W_2$, to a second input to adder 52. Adder 52 adds the two input signals and generates an output signal that is applied as a second input to quadrature coupler 56.

Quadrature coupler 56 adds the two input signals in quadrature and generates two separate outputs on leads 57 and 58. The signals on leads 57 and 58 are amplified in amplifiers 60 and 61, respectively, of power amplifier section 34. The phase information is preserved by amplifiers 60 and 61, but amplitude information may be distorted due to nonlinear gain characteristics. Amplifiers 60 and 61 should have substantially identical gain characteristics. These two signals from amplifiers 60 and 61 are combined in a second quadrature coupler 64 to produce an output R(t) at output terminal 36 which is very nearly a linearly amplified replica of the input signal r(t).

To illustrate the LIND performance, the case is examined where amplifiers 60 and 61 are saturated and deliver an output signal with a constant amplitude $E_0$. If an overall LIND gain of G with minimum low-level distortion is desired, the weighting coefficients may be chosen to be $W_0 = 1$, $W_1 = G/\sqrt{2} \ E_0 \alpha$, and $W_2 = -(\frac{1}{2})W_1^2$. Neglecting a constant $\pi/2$ phase lag, the LIND output at output terminal 36 is $$R(t) = Gr(t) \left[ 1 + \frac{1}{4} \left( \frac{Ga(t)}{2E_0} \right)^4 \right]^{-\frac{1}{2}} \quad (2)$$

The output R(t) at output terminal 36 is very nearly a linearly amplified replica of the input r(t) found at input terminal 30. From equation (2) it can be seen that the first nonlinear distortion term is fifth order in the input amplitude a(t).

It is to be understood that the hereinabove choice of weighting coefficients is for exemplary purposes only. Where a distortion criterion other than the minimum low-level distortion demanded above is desired, a different choice of weighting coefficients may result. For a LIND with a gain G, the percent distortion of the circuit of FIG. 1, as a function of the input amplitude a(t), is $$D(a) = \sqrt{\left(\frac{Ga}{2E_0}\right)^2 + (1 + W_2\alpha^2 a^2)^2} \quad (3)$$

Thus, for example, if zero distortion for an input amplitude $a_0$ is desired, instead of the minimum low-level distortion demanded above, then the equation $D(a_0) = 1$ may be solved to give the appropriate value for $W_2$.

Figure 2:
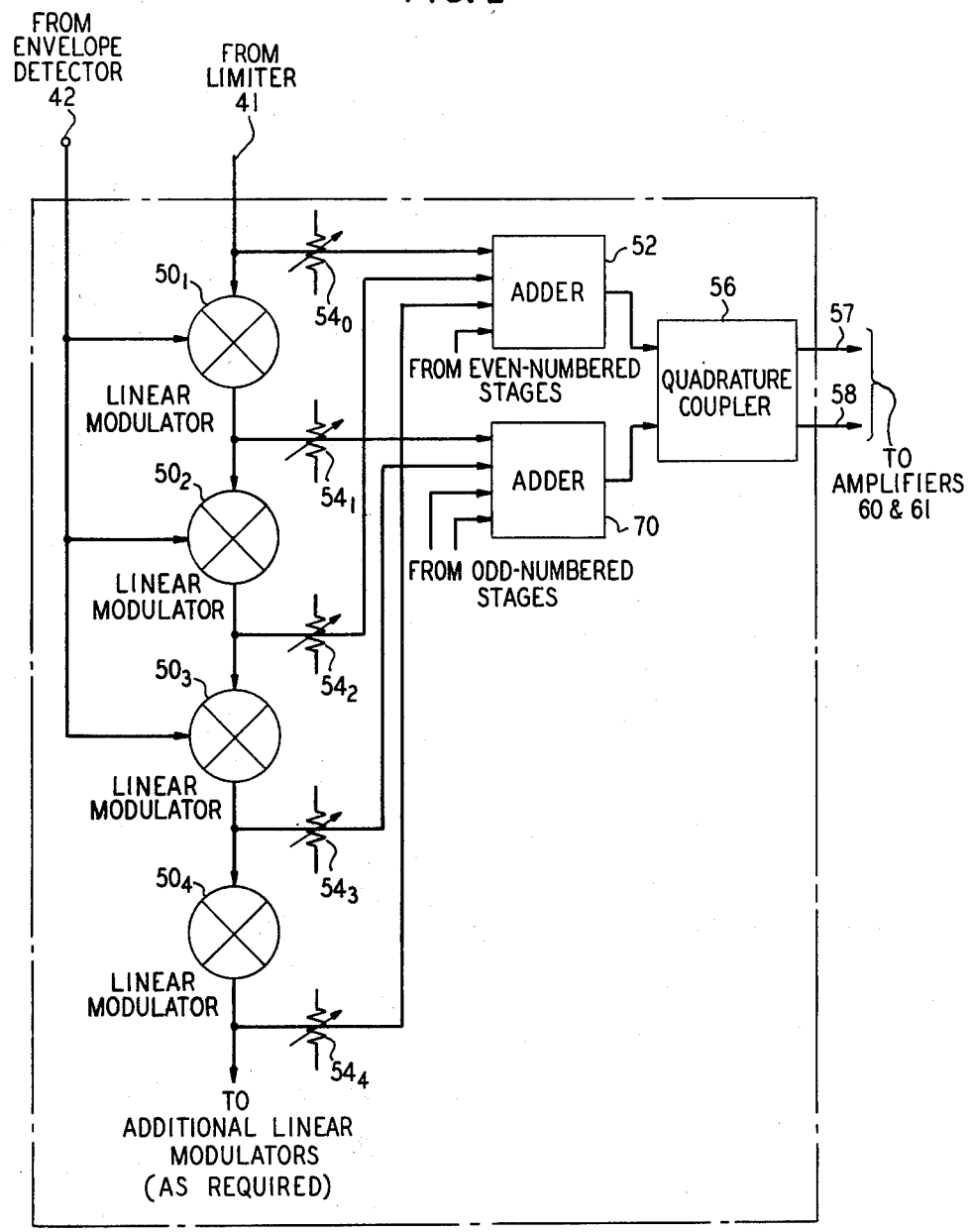
FIG. 2 is a block diagram of a precision phase modulator for use in FIG. 1 which comprises a plurality of n amplitude modulators in cascade.

In FIG. 1 the linear phase modulator portion of component separator 32 is shown as comprising only a first and second linear amplitude modulator $50_1$ and $50_2$ in cascade and one adder circuit 52. It is to be understood that such arrangement is exemplary only and that more than two linear amplitude modulators 50 in a cascade arrangement can be used. In general, more linear amplitude modulators connected in cascade result in improved LIND linearity. In FIG. 2, four linear amplitude modulators $50_1$-$50_4$ are shown for exemplary purposes only and, as indicated in FIG. 2, additional modulators 50 can be added in cascade after modulator $50_4$.

In the LIND of FIG. 2, which is similar to that shown in FIG. 1, the signal from limiter 41 and the outputs from linear modulators $50_1$-$50_4$ are tapped off and applied to appropriate weighting circuits $54_0$-$54_4$, respectively.

The weighted limiter 41 output signal and the weighted output signals of the even-numbered modulators $50_2$, $50_4$, etc. of the cascade are applied to separate inputs of first adder circuit 52 while the weighted outputs of the odd-numbered modulators $50_1$, $50_3$, etc. are applied to separate inputs of a second adder circuit 70. The outputs of the two adder circuits 52 and 70 are added in quadrature by quadrature coupler 56 to produce the output signals on leads 57 and 58 which will provide inputs to amplifiers 60 and 61, respectively in the manner previously described for the arrangement of FIG. 1.

As described hereinbefore for a phase modulator comprising two linear modulators, LIND performance for the case of four linear modulators will be illustrated by examining the case where a circuit of gain G with minimum low-level distortion is desired, and amplifiers 60 and 61 produce a constant amplitude output signal $E_0$. For weighting coefficients of $W_0=1$, $W_1=G/\sqrt{2}$ $E_0\alpha$, $W_2=-\frac{1}{8}W_1^2$, $W_3=0$, and $W_4=-\frac{1}{8}W_1^4$, the first nonlinear distortion term in the LIND output at output terminal 36 will be found to be seventh order in the input amplitude a(t). This is superior to the fifth-order distortion present when only two linear modulators are used, as shown in FIG. 1.

For the particular choice of weighting coefficients shown above, adder 70 is not required because $W_3=0$ and the output from linear modulator $50_1$, via weighting circuit $54_1$, can be directly connected to the second input of quadrature coupler 56. As explained previously for the circuit of FIG. 1, a different distortion criterion will result, in general, in different weighting coefficients. Therefore, for the cases where four linear modulators are used and the weighting coefficients $W_3 \neq 0$, adder 70 would be required.

It is to be understood that the above-described embodiments are simply illustrative of the principles of the invention. Various other modifications and changes may be made by those skilled in the art which will embody the principles of the invention and fall within the spirit and scope thereof.

I claim:

1. A circuit for linearly amplifying a bandpass input signal having amplitude and phase variations comprising:
    a component separator comprising means for generating from the input signal a first signal representative of an amplitude limited version of the input signal and a second signal representative of the amplitude envelope of the input signal and a phase modulator connected to said first and second signal generating means, the component separator producing a first and a second output signal which are substantially constant in amplitude;
    a first and a second amplifier coupled to enable reception and amplification of the first and second output signal, respectively, from the component separator; and
    a coupler capable of combining the two amplified signals to produce a restructured replica of the bandpass input signal
    CHARACTERIZED IN THAT
    the phase modulator comprises
    a first and second linear suppressed-carrier amplitude modulator with each modulator comprising a first and a second input terminal and an output terminal, the first and second modulators being connected in a cascade arrangement with the output of the first modulator connected to the first input of the second modulator and the first terminal of the first modulator and the second terminals of both modulators being connected to receive the first and second signals, respectively, from said generating means;
    adding means having input terminals thereof connected to receive the first signal from the generating means and the output from the second linear modulator;
    a quadrature coupler capable of combining in quadrature the output signals from said adding means and the output from said first linear modulator; and
    a first and a second weighting means disposed between the outputs of the first and second linear modulator and the inputs to the quadrature coupler and adding means, respectively, each weighting means being capable of introducing a separate predetermined weighting factor to the signal passing therethrough.

2. The circuit for linearly amplifying a bandpass input signal in accordance with claim 1
    CHARACTERIZED IN THAT
    the coupler capable of combining the two amplified signals comprises a quadrature coupler capable of combining in quadrature the two amplified signals.

3. The circuit for linearly amplifying a bandpass input signal in accordance with claim 1 or 2
    CHARACTERIZED IN THAT
    the first and second amplifiers comprise substantially identical gain characteristics, which may be nonlinear.

4. The circuit for linearly amplifying a bandpass input signal in accordance with claim 1 or 2
    CHARACTERIZED IN THAT
    the phase modulator further comprises
    a third linear suppressed-carrier amplitude modulator comprising a first and a second input terminal and an output terminal, said third amplitude modulator being connected in cascade with said first and second amplitude modulators with the first input terminal connected to the output terminal of the second amplitude modulator in the cascade and the second input terminal being connected to receive the second signal of said component separator generating means;
    a third weighting means disposed to introduce a predetermined weighting factor to the output signal from the third amplitude modulator; and
    a second adding means comprising a plurality of input terminals and an output terminal, said second adding means being disposed to both receive the weighted output signals from the first and the third amplitude modulator at separate input terminals and transmit the added input signals to the quadrature coupler for combining in quadrature with the output of the first adding means.

5. The circuit for linearly amplifying a bandpass input signal in accordance with claim 1 or 2
    CHARACTERIZED IN THAT
    the generating means of the component separator comprises
    a limiting means capable of generating from the input signal the first signal representative of the amplitude limited version of the input signal; and
    an envelope detecting means capable of generating from the input signal the second signal representative of the amplitude envelope of the input signal.

* * * * *